United States Patent
Sugimoto et al.

(10) Patent No.: US 6,246,106 B1
(45) Date of Patent: Jun. 12, 2001

(54) LEAD FRAME

(75) Inventors: Hiroshi Sugimoto; Shigeo Hagiya; Noriaki Taketani; Takaharu Yonemoto; Osamu Yoshioka, all of Ibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 08/886,976

(22) Filed: Jul. 3, 1997

(30) Foreign Application Priority Data

Jul. 5, 1996 (JP) .................................................. 8-176115

(51) Int. Cl.⁷ .................................................. H01L 23/495
(52) U.S. Cl. .......................... 257/666; 257/672; 257/676
(58) Field of Search ..................... 257/666, 676, 257/787, 660, 672

(56) References Cited

U.S. PATENT DOCUMENTS

| | | | |
|---|---|---|---|
| 5,442,229 | * 8/1995 | Mori et al. | 257/666 |
| 5,572,066 | * 11/1996 | Safai et al. | 257/666 |
| 5,663,594 | * 9/1997 | Kimura | 257/666 |
| 5,812,381 | * 9/1998 | Shigeta et al. | 257/672 |

FOREIGN PATENT DOCUMENTS 4-75355   3/1992  (JP) .

* cited by examiner

*Primary Examiner*—Roy Potter
(74) *Attorney, Agent, or Firm*—McDermott, Will & Emery

(57) ABSTRACT

A lead frame is provided which enables a coating of an insulating adhesive for fixing a semiconductor chip to be evenly and thickly foamed on inner leads. In a lead frame wherein an insulating adhesive for fixing a semiconductor chip is applied to a semiconductor chip mounting region, inner leads 1 are set to a value of w/s of not more than 1 wherein w represents the lead width and s represents the lead spacing.

2 Claims, 2 Drawing Sheets

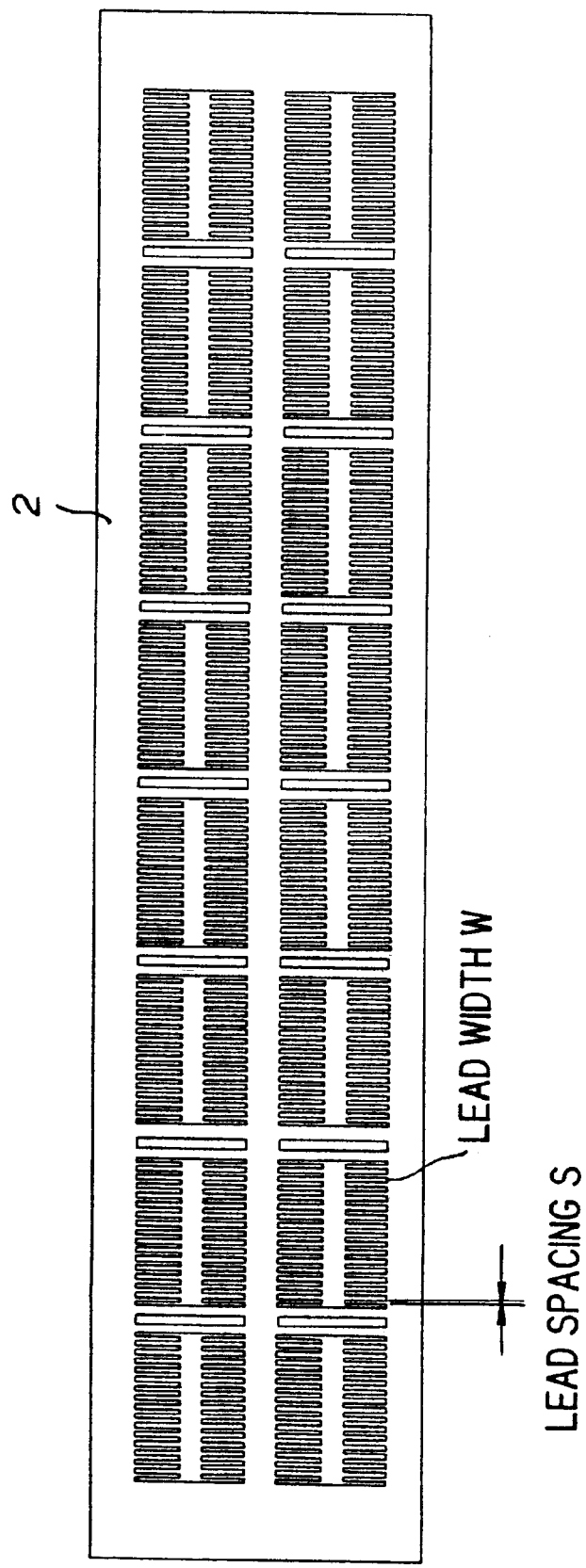

LEAD FRAME

BACKGROUND OF THE INVENTION

1. Field of the Invention

The present invention relates to a lead frame for a semiconductor device and in particular to a lead frame for a semiconductor device which is subjected to mold packaging.

2. Description of the Related Art

Lead frames for semiconductor devices having a COL (chip on lead) or LOC (lead on chip) structure, which can realize high density assembly, are known in the art. One of them is a lead frame used in a system where a high heat-resistant insulating film coated with a thermoplastic or thermosetting adhesive layer is applied to one side or both sides of the lead frame and a semiconductor chip is mounted on the high heat-resistant insulating film under heating or under pressure.

For the lead frame in this system, it is common practice to use a polyimide film as the high heat-resistant insulating film, and, in the application of the film to the lead frame, die stamping application is used. Specifically, a film in a reel form is stamped by means of a die into a desired shape and then applied to the lead frame under heating or under pressure.

According to this method, the film is stamped by means of a die, and the stamped film is then applied to the lead frame in its desired position. Therefore, the amount of the tape used is large, resulting in increased cost. Further, since stamping of the film produces a waste film, the material is wasted. Furthermore, absorption of moisture into the polyimide film leads to a fear of package cracks being created.

In order to eliminate such inconvenience, a method has been proposed which comprises: coating an adhesive onto a lead frame in its area where a semiconductor device is to be mounted; and jointing (bonding) the semiconductor device to the lead frame with the aid of this adhesive.

For the coating of the adhesive, a device comprising a combination of an X-Y robot with a dispenser is generally used to coat the adhesive onto a lead frame in its area where a semiconductor device is to be mounted (for example, a front end of an inner lead). in particular, when an adhesive is applied to the front end of the lead, a spot coating method is used. In this method, what is required is only to coat a required amount of the adhesive onto the lead frame. Therefore, no waste material is produced, and no expensive die is required, advantageously resulting in reduced production cost.

A varnish adhesive (for example, a solution of an adhesive resin in a solvent) is coated by ejecting the adhesive through a capillary needle (or nozzle) by means of air pressure onto a lead frame in its predetermined area while moving the needle (or nozzle) on the lead frame.

A lead frame using the conventional adhesive coating means poses problems including (i) that it is difficult to provide a thick coating and (ii) that a variation in coating thickness occurs when leads to be coated with an adhesive do not have an identical or substantially identical shape and lead spacing. A large variation in coating thickness leads to a fear that, in bonding a semiconductor chip to a lead frame, thickly coated leads alone are bonded to the semiconductor chip with thinly coated lead remaining unbonded to the semiconductor chip. The lead which could not be bonded to the semiconductor chip becomes floated and, hence, instable, adversely affecting the subsequent wire bonding.

Even though leads have an identical or substantially identical shape and lead spacing, a lead spacing smaller than the lead width makes it difficult to form a thick coating although an even coating could be formed. In this case, conditions for bonding a semiconductor chip to the lead frame cannot be easily determined, and, in addition, large impact occurs at the time of bonding. Further, when the distance between the semiconductor chip and the lead frame is excessively small, a resin cannot be flowed into between the leads, leading to a fear of a cavity being created and, in addition, adversely affecting the reliability of the semiconductor device.

SUMMARY OF THE INVENTION

Accordingly, an object of the present invention is to provide a lead frame which enables an insulating adhesive for fixing a semiconductor chip to be evenly and thickly coated onto inner leads.

The above object can be attained, according to the present invention, by a lead frame for fixing a semiconductor chip mounted with the aid of an insulating adhesive coated on inner leads in their predetermined areas, wherein the inner leads have a lead width equal to or smaller than a lead spacing in at least the predetermined areas.

When the lead width is larger than the lead spacing, the leads collectively constitute a sheet having substantially no gap therebetween, causing the adhesive coated to be spread. Therefore, in this case, the coating thickness is small. On the other hand, when the lead width/lead spacing value is brought to not more than 1, the adhesive stays on the leads, permitting the coating thickness to be made even and large.

BRIEF DESCRIPTION OF THE DRAWINGS

FIG. 3 is a plan view showing the shape of a work for use in a verification of the present invention.

PREFERRED EMBODIMENTS OF THE INVENTION

A preferred embodiment of the present invention will be described with reference to the accompanying drawings.

Figure 1:
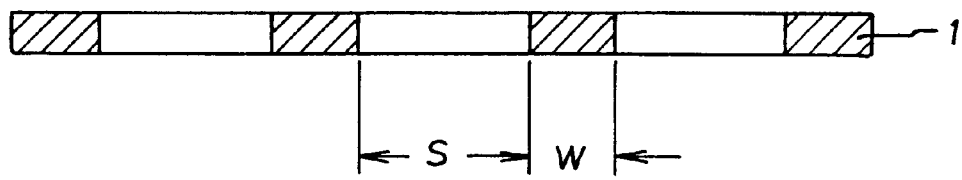
FIG. 1 is a cross-sectional view showing an inner lead section of the lead frame according to the present invention.

FIG. 1 is a cross-sectional view showing an inner lead section of the lead frame according to the present invention. Inner leads 1 are provided at equal intervals on the same plane. Outer leads (not shown) are linked to the respective inner leads 1. The lead frame has a frame section, a dam bar and the like.

According to the present invention, in the inner leads 1, the ratio of lead spacing a of sites to be coated with an insulating adhesive for fixing a semiconductor chip to the lead width w is set to s:w=not more than 1:1. Specifically, the lead width w is made smaller than lead spacings. This permits a layer of an insulating adhesive to be thickly and evenly formed on the inner leads 1, enabling the fixation of a semiconductor chip and wire bonding to be stably performed.

Embodiments of the present invention will be described.

Figure 2:
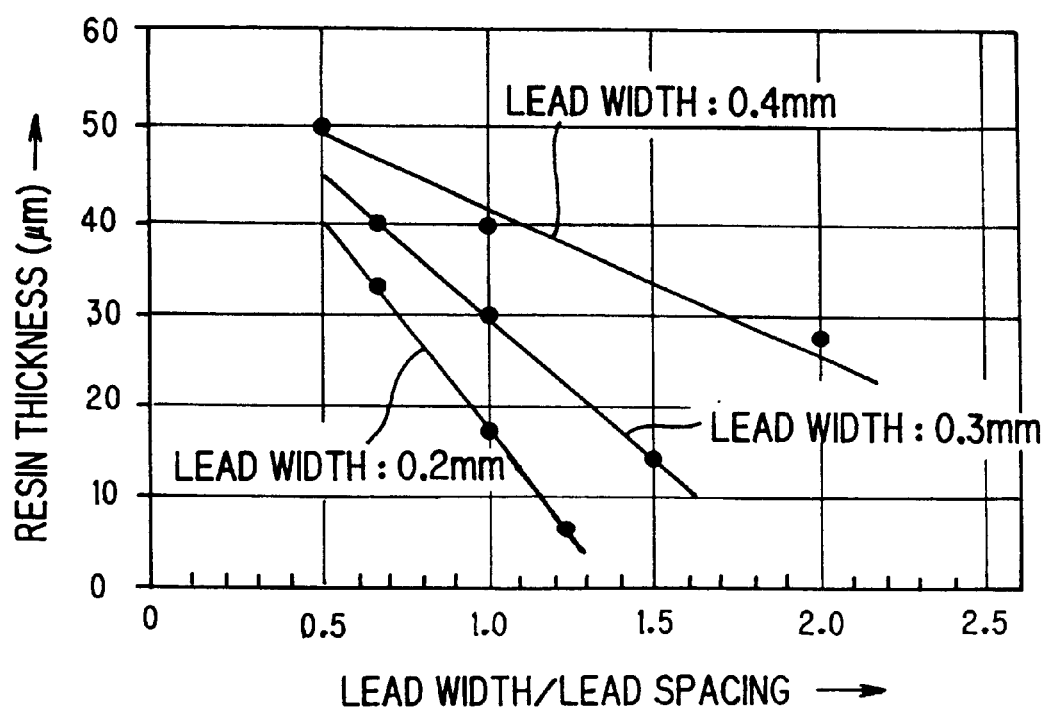
FIG. 2 is a graph showing the relationship between the lead width to lead spacing ratio and the resin coating thickness of the lead frame according to the present invention.

FIG. 2 is a graph showing the relationship between the lead width w to lead spacings ratio and the resin coating thickness in the lead frame according to the present invention. In the determination of this relationship, a work 2 having a shape shown in FIG. 3 is used, and the width of the leads to be coated with an insulating adhesive is relative small and 0.2 to 0.4 mm. The lead width w to lead spacing s ratio is 0.3 to 2.5. Further, the number of leads is about 20 to 50.

The insulating adhesive used was thermoplastic and had a glass transition temperature of 220° C. In use, it was dissolved in a solvent to prepare a varnish. The resultant varnish had a viscosity of 20,000 cp and a solid content of 30%. The insulating adhesive was coated onto the lead frame as follows. The insulating adhesive in a varnish form was placed in a container. Air pressure was fed into the container, and the varnish was continuously ejected toward the inner leads 1 through a needle (or a nozzle) being moved at a constant speed on each lead in the arranged direction thereof.

As a result, as can be seen from FIG. 2, the resin coating thickness decreased with increasing the lead width to lead spacing ratio, that is, increasing the lead width or decreasing the lead spacing. The reason why the resin coating thickness decreases is that, since the ejection of the adhesive through the needle is continued even during moving from one lead to another lead, the resin coating thickness decreases with decreasing the lead spacing. In this connection, as shown in FIG. 2, as the lead width is increased to 0.2 mm→0.3 mm→0,4 mm, the resin coating thickness increases even when the lead width to lead spacing ratio is identical.

The above results show that a necessary resin coating thickness can be obtained when the lead width to lead spacing ratio is not more than 1. Even in the case of a lead width to lead spacing ratio of not less than 1, the adhesive is coatable in a certain ratio range. In this case, however, the resin coating thickness is small. The total of the lead width and the lead spacing is called "lead pitch," and no problem is raised associated with the design of the lead frame so far as this dimension is identical. For example, when the lead width is 0.3 mm with the lead width to lead spacing ratio being 1.5, the lead spacing is 0.2 mm. In this case, the thickness of the resin coating is about 14 $\mu$m [middle line in FIG. 2]. On the other hand, even though the lead pitch is the same as that described above, i.e., 0.5 mm, when the lead width is 0.2 mm with the lead spacing being 0.3 mm, the lead width to lead spacing ratio is 2:3, providing a resin coating thickness of about 33 $\mu$m [left line in FIG. 2].

What is claimed is:

1. A lead frame comprising inner leads coated at predetermined positions with insulative adhesives for fixing a semiconductor chip on said predetermined positions of said inner leads;

each of said inner leads having an identical shape to each other, each of said inner leads being spaced apart from an adjacent one of said inner leads by an identical spacing, and each of said inner leads having a width in a range from about 0.2 mm to about 0.4 mm with said width being not greater than said spacing.

2. A lead frame comprising inner leads coated by using a dispenser at predetermined positions thereof with a layer consisting of insulative adhesive for fixing a semiconductor chip on said predetermined positions of said inner leads;

each of said inner leads having an identical shape to each other, each of said inner leads being spaced apart from an adjacent one of said inner leads by an identical spacing, and each of said inner leads having a width in a range from about 0.2 mm to about 0.4 mm with said width being not greater than said spacing.

* * * * *